United States Patent
Sugiyama et al.

(10) Patent No.: US 8,405,443 B2
(45) Date of Patent: Mar. 26, 2013

(54) PASS TRANSISTOR CIRCUIT WITH MEMORY FUNCTION, AND SWITCHING BOX CIRCUIT INCLUDING THE PASS TRANSISTOR CIRCUIT

(75) Inventors: Hideyuki Sugiyama, Kawasaki (JP); Tetsufumi Tanamoto, Kawasaki (JP); Takao Marukame, Tokyo (JP); Mizue Ishikawa, Yokohama (JP); Tomoaki Inokuchi, Kawasaki (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/419,555

(22) Filed: Mar. 14, 2012

(65) Prior Publication Data

US 2012/0223762 A1    Sep. 6, 2012

Related U.S. Application Data

(63) Continuation of application No. PCT/JP2009/066678, filed on Sep. 25, 2009.

(51) Int. Cl.
*H03K 17/687* (2006.01)

(52) U.S. Cl. ............ 327/427; 327/434; 365/185.05; 326/38

(58) Field of Classification Search ............ 327/427, 327/434; 365/185.05; 326/38
See application file for complete search history.

(56) References Cited

U.S. PATENT DOCUMENTS

| | | | |
|---|---|---|---|
| 4,713,792 A * | 12/1987 | Hartmann et al. | 711/103 |
| 5,247,478 A * | 9/1993 | Gupta et al. | 365/185.1 |
| 5,841,694 A * | 11/1998 | Wong | 365/185.05 |
| 6,356,478 B1 * | 3/2002 | McCollum | 365/185.01 |
| 7,245,535 B2 * | 7/2007 | McCollum et al. | 365/185.18 |
| 7,430,137 B2 * | 9/2008 | Greene et al. | 365/185.05 |
| 7,742,336 B2 * | 6/2010 | Ogura et al. | 365/185.03 |
| 2005/0045919 A1 | 3/2005 | Kaeriyama et al. | |
| 2007/0064484 A1 | 3/2007 | McCollum et al. | |
| 2008/0061336 A1 | 3/2008 | Sugahara et al. | |

FOREIGN PATENT DOCUMENTS

| | | |
|---|---|---|
| JP | 2006-339235 | 12/2006 |
| JP | 2009-59807 | 3/2009 |
| JP | 2009-509460 | 3/2009 |
| JP | 2009-124175 | 6/2009 |
| JP | 2009-135533 | 6/2009 |

OTHER PUBLICATIONS

International Search Report mailed Dec. 22, 2009 in PCT/JP09/066678 filed Sep. 25, 2009 (in English).

(Continued)

*Primary Examiner* — Kenneth B. Wells
(74) *Attorney, Agent, or Firm* — Oblon, Spivak, McClelland, Maier & Neustadt, L.L.P.

(57) ABSTRACT

A pass transistor circuit according to an embodiment includes: a first input/output terminal connected to a first signal line; a second input/output terminal connected to a second signal line; a first device having a first terminal connected to a first power supply and a second terminal; a second device having a third terminal connected to the second terminal and a fourth terminal connected to a second power supply; a first transistor having one of source/drain connected to the second terminal, a gate receiving a first control signal; and a second transistor having a gate connected to the other one of source/drain of the first transistor, one of source/drain connected to the first input/output terminal, and the other one of source/drain connected to the second input/output terminal. One of the first and second devices is a nonvolatile memory device, the other one of the first and second devices is a MOSFET.

16 Claims, 14 Drawing Sheets

OTHER PUBLICATIONS

Satoshi Sugahara et al., "Spin MOSFETs as a Basis for Spintronics", ACM Transactions on Storage, vol. 2, No. 2, May 2006, pp. 197-219.

English translation of the International Preliminary Report on Patentability issued Apr. 19, 2012, in PCT/JP2009/066678.

English translation of the Written Opinion of the International Searching Authority issued Dec. 22, 2009, in PCT/JP2009/066678.

Guy Lemieux et al., "Routing Switch Circuit Design", Design of Interconnection Networks for Programmable Logic, Kluwer Academic publishers, ISBN: 1-4020-7700-9, chapter 6, pp. 101-139, Nov. 30, 2003.

* cited by examiner

PASS TRANSISTOR CIRCUIT WITH MEMORY FUNCTION, AND SWITCHING BOX CIRCUIT INCLUDING THE PASS TRANSISTOR CIRCUIT

CROSS-REFERENCE TO RELATED APPLICATION

This application is based upon and claims the benefit of priority from prior PCT/JP2009/066678 filed on Sep. 25, 2009, the entire contents of which are incorporated herein by reference.

FIELD

Embodiments described herein relate generally to a pass transistor circuit with memory function, and to a switching box circuit including the pass transistor circuit.

BACKGROUND

In recent years, spin electronics devices utilizing the spin freedom of electrons have been actively researched and developed. Active research and development based on the tunnel magnetoresistance (TMR) effects have led to applications such as magnetic random access memories (MRAMs) and read heads in hard disk drives (HDDs). Further, spin transistors formed by combining semiconductor and magnetic material are drawing attention.

As a reconfigurable logic circuit developed based on today's semiconductor technologies, there is an integrated circuit called FPGA (Field Programmable Gate Array). An FPGA stores information in static random access memories (SRAMs) provided therein, and, based on the information stored in the memories, the FPGA can control logics and connections in the reconfigurable logic circuit. As logics can be changed by software, corrections can be made to circuits after the manufacture of hardware. In recent years, this technique has rapidly spread as the means to realize complicated integrated circuits in short periods of time at low costs.

A large number of switching box circuits are used in an FPGA. A switching box circuit is a circuit that stores a connected state of signal lines extending from four different directions, and determines inputs and outputs through the signal lines, and connections and disconnections among the signal lines. A circuit including such switching box circuits can realize any connected state by rewriting the memories.

In a switching box circuit, the output of a memory is connected to a pass transistor circuit. Each pass transistor circuit serves as a switch, and determines a connection and a disconnection between signal lines, based on the information stored in the memory.

Where a switching box circuit is manufactured by semiconductor CMOS technology, SRAMs are used as memories to store information. Therefore, the number of devices becomes large. Since such a switching box circuit uses a large number of SRAMs, the power consumption becomes large due to the leakage current even when any operation is not being performed. As a result, it becomes difficult to achieve high integration with such circuits.

As a large number of pass transistor circuits are used in each one switching box circuit, the circuit size becomes extremely large, and becomes one of the factors that hinder high integration.

Further, SRAMs are volatile memories that lose information once the power supply is cut off. Therefore, every time the power supply is switched on, information stored in an external memory needs to be written into those SRAMs. As a result, trouble and time need to be taken every time the power supply is switched on.

There is a need to prepare the external memory to store information when the power supply is cut off, and extra power and space are required for the external memory. This is one of the factors that hinder high integration and a decrease in power consumption in the entire system.

DETAILED DESCRIPTION

Figure 1:
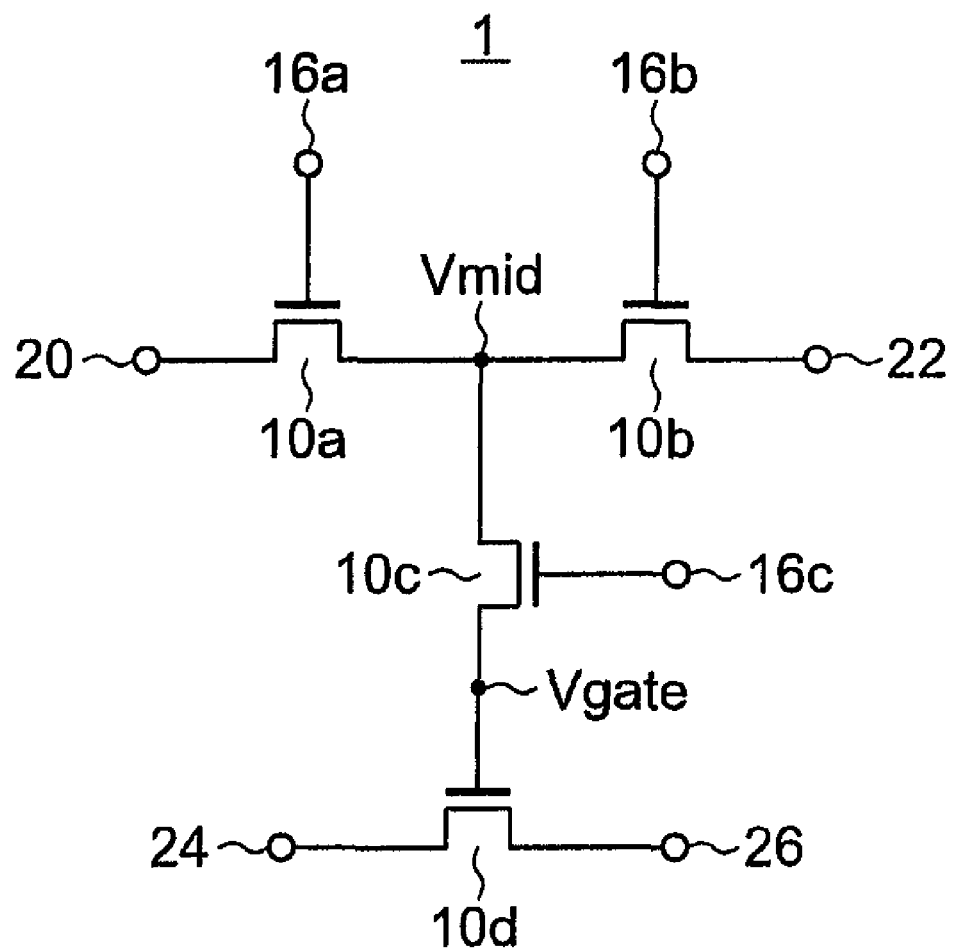
FIG. 1 is a circuit diagram of a pass transistor circuit according to an embodiment.

A pass transistor according to an embodiment includes: a first input/output terminal connected to a first signal line; a second input/output terminal connected to a second signal line; a first device having first and second terminals, the first terminal being connected to a first power supply; a second device having third and fourth terminals, the third terminal being connected to the second terminal, the fourth terminal being connected to a second power supply; a first transistor, one of the source/drain of the first transistor being connected to the second terminal, a gate of the first transistor receiving a first control signal; and a second transistor, a gate of the second transistor being connected to the other one of the source/drain of the first transistor, one of source/drain of the second transistor being connected to the first input/output terminal, the other one of the source/drain of the second transistor being connected to the second input/output terminal, one of the first and second devices being a nonvolatile memory device, the other one of the first and second devices being a MOSFET.

The following is a detailed description of embodiments, with reference to the accompanying drawings. It should be noted that the drawings are schematic diagrams, and the sizes of respective components, the magnitudes of respective voltages, the lengths of respective periods of time, the size ratios among the components, the ratios among the voltages, the time intervals, and the like differ from those in reality. The sizes and ratios of the same components illustrated in two or more drawings might vary among the drawings.

Before embodiments are described, a pass transistor circuit with memory function according to each embodiment is briefly described. Each embodiment provides a pass transistor circuit with memory function including a nonvolatile memory device. As the nonvolatile memory device, a spin MOSFET or an MTJ (Magnetic Tunneling Junction) device is used. A spin MOSFET includes ferromagnetic layers as the source and drain electrodes in a conventional MOSFET structure. Depending on the magnetization directions of the ferromagnetic layers, the characteristics of the spin MOSFET change, and memory function is provided. An MTJ device has a structure in which a tunnel barrier is interposed between two magnetic layers. Depending on the magnetization directions of the two magnetic layers, the resistance value varies, and memory function is provided. Therefore, where a spin MOSFET or an MTJ device is used, a pass transistor circuit with memory function can be formed with a small number of devices. Since a spin MOSFET and an MTJ device realize memory functions with the use of ferromagnetic layers and are nonvolatile, there is no need to perform writing to a memory in a switching box circuit every time the power supply is activated. Since such a pass transistor circuit includes a nonvolatile memory, the power supply can be switched off when the pass transistor circuit is not performing any operation. Therefore, a switching box circuit that consumes only a small amount of power can be formed.

The value of the resistance between the two ferromagnetic layers in a spin MOSFET varies depending on the magnetization directions of the two ferromagnetic layers. The magnetization directions of the magnetic layers of the source and drain electrodes in such a spin MOSFET are either in a substantially parallel state or a substantially antiparallel state, and the resistance between the two ferromagnetic layers is either high or low. Likewise, in an MTJ device, the value of the resistance between the two ferromagnetic layers varies depending on the magnetization directions of the two ferromagnetic layers. A state in which the value of the resistance between the two ferromagnetic layers is low is called a low resistance state, and a state in which the value of the resistance is high is called a high resistance state.

FIG. 1 shows a pass transistor circuit with memory function according to an embodiment. This pass transistor circuit 1 includes four transistors $10a$, $10b$, $10c$, and $10d$. At least one of the transistors $10a$ and $10b$ is a spin MOSFET. The transistor $10a$ has a source connected to a first power supply 20, a gate connected to a first terminal $16a$, and a drain connected to the drain of the transistor $10b$. The transistor $10b$ has a source connected to a second power supply 22, and a gate connected to a second terminal $16b$. That is, the transistors $10a$ and $10b$ are connected in series. The transistor $10c$ has a source connected to the drains of the transistors $10a$ and $10b$, a gate connected to a third terminal $16c$, and a drain connected to the gate of the transistor $10d$. The transistor $10d$ has a source connected to a first input/output terminal 24, and a drain connected to a second input/output terminal 26. A timing signal (a control signal), a source voltage Vdd, or a reference voltage GND is applied to each of the first through third terminals $16a$, $16b$, and $16c$.

Figure 14:
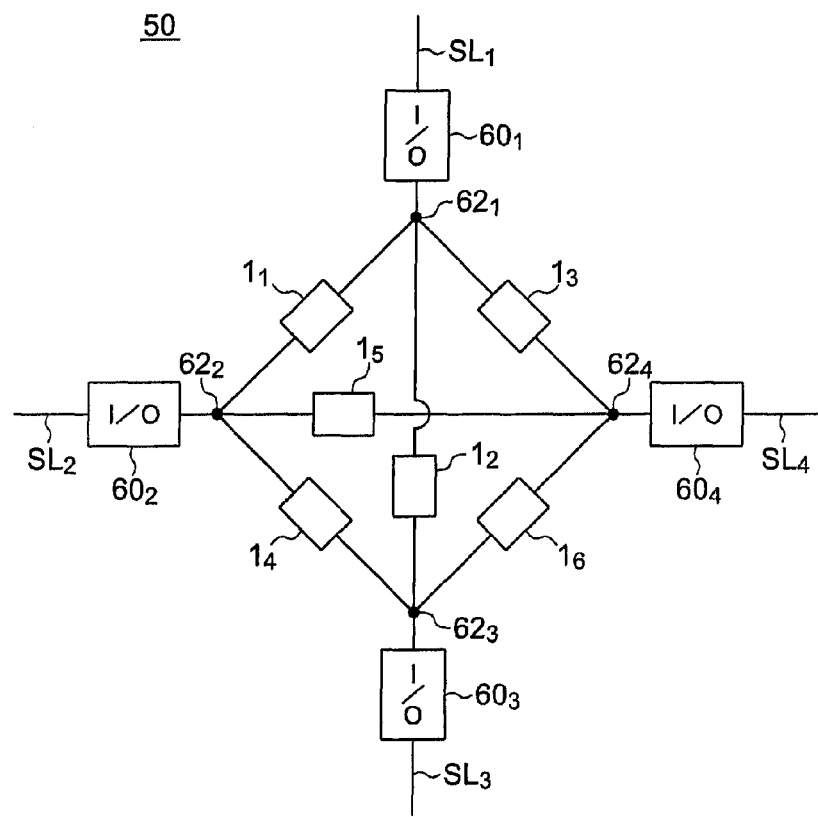
FIG. 14 is a circuit diagram of a switching box circuit according to an embodiment.

FIG. 14 shows a specific example of a switching box circuit including pass transistor circuits 1 of the above embodiment of the present invention. A switching box circuit is normally a circuit that determines connections and disconnections in a region where signal lines extending from four different directions meet. A switching box circuit of this specific example determines connections and disconnections among four signal lines $SL_1$, $SL_2$, $SL_3$, and $SL_4$. The switching box circuit 50 includes four input/output units $60_1$ through $60_4$, four connection nodes $62_1$ through $62_4$, and six pass transistor circuits $1_1$ through $1_6$. Each of the pass transistor circuits $1_1$ through $1_6$ has the same structure as that of the pass transistor circuit 1 of the above described embodiment.

The four signal lines $SL_1$, $SL_2$, $SL_3$, and $SL_4$ are arranged in four directions, respectively. In FIG. 14, the signal line $SL_1$ is located on the upper side, the signal line $SL_2$ is located on the left side, the signal line $SL_3$ is located on the lower side, and the signal line $SL_4$ is located on the right side. An input/output unit $60_i$ is connected to each signal line $SL_i$ (i=1, ..., 4). A connection node $62_i$ is connected to each input/output unit $60_i$ (i=1, ..., 4). The pass transistor circuit $1_1$ has one of the first and second input/output terminals connected to the connection node $62_1$, and has the other one of the input/output terminals connected to the connection node $62_2$. The pass transistor circuit $1_2$ has one of the first and second input/output terminals connected to the connection node $62_1$, and has the other one of the input/output terminals connected to the connection node $62_3$. The pass transistor circuit $1_3$ has one of the first and second input/output terminals connected to the connection node $62_1$, and has the other one of the input/output terminals connected to the connection node $62_4$. The pass transistor circuit $1_4$ has one of the first and second input/output terminals connected to the connection node $62_2$, and has the other one of the input/output terminals connected to the connection node $62_3$. The pass transistor circuit $1_5$ has one of the first and second input/output terminals connected to the connection node $62_2$, and has the other one of the input/output terminals connected to the connection node $62_4$. The pass transistor circuit $1_6$ has one of the first and second input/output terminals connected to the connection node $62_3$, and has the other one of the input/output terminals connected to the connection node $62_4$. Therefore, each one of the signal lines can be connected to another signal line through an input/output unit, a connection node, a pass transistor circuit, a connection node, and an input/output unit. For example, the signal line $SL_1$ is connected to the signal line $SL_2$ via the route formed by the input/output unit $60_1$, the connection node $62_1$, the pass transistor circuit $1_1$, the connection node $62_2$, and the input/output unit $60_2$.

Figure 15:
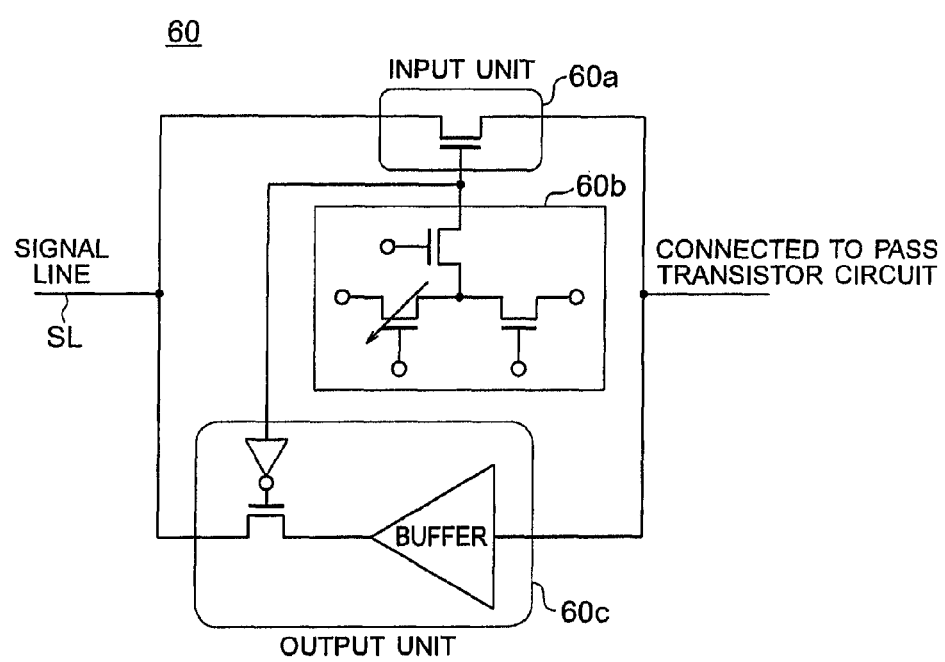
FIG. 15 is a block diagram of a specific example of an input/output unit.

FIG. 15 shows a specific example of an input/output unit 60 of the above described switching box circuit 50. The input/output unit 60 of this specific example includes an input unit $60a$, a memory unit $60b$, and an output unit $60c$. As shown in FIG. 15, the memory unit $60b$ includes a pass transistor circuit consisting of one nonvolatile storage device (a spin MOSFET) and two transistors. Connections are established so that only one of the input unit $60a$ and the output unit $60c$ becomes conductive.

Therefore, in a case where a pass transistor circuit 1 is used in the switching box circuit 50, the first input/output terminal 24 is connected to a signal line in one of the four directions via an input/output unit, and the second input/output terminal 26 is connected to a signal line in another direction via another input/output unit. That is, the transistor $10d$ serves as a pass transistor. Depending on the on/off state of this pass transistor, connections and disconnections among the signal lines are determined.

Figure 2:
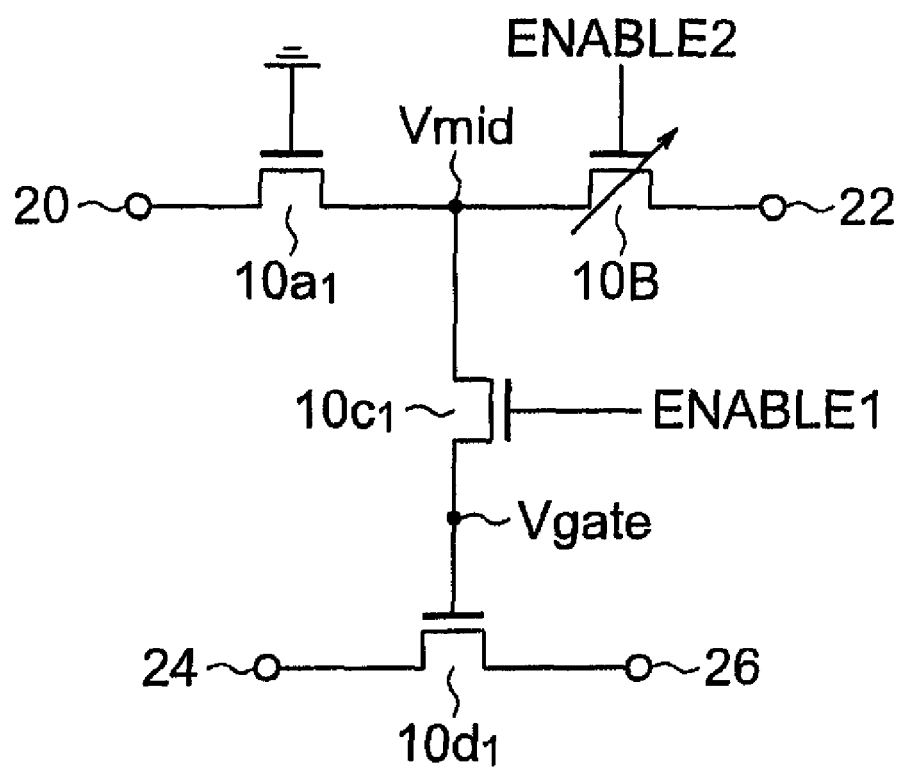
FIG. 2 is a circuit diagram of a pass transistor circuit according to an embodiment.

FIG. 2 shows a pass transistor circuit 1 that is the same as that of the above described embodiment of the present invention, except that the transistor 10a is replaced with a p-type MOSFET 10a1, the transistor 10b is replaced with an n-type spin MOSFET 10B, and the transistors 10c and 10d are replaced with n-type MOSFETs 10c1 and 10d1, respectively. In this pass transistor circuit 1, the source voltage Vdd is applied to the first power supply 20, and the reference voltage GND is applied to the second power supply 22. Further, the reference voltage GND is applied to the gate of the transistor 10a1, and control signals ENABLE2 and ENABLE1 input into the gate of the spin MOSFET 10B and the gate of the transistor 10c1, respectively.

The pass transistor circuit 1 of this embodiment has charging periods and operating periods. Before the pass transistor circuit 1 is made to perform a logic operation, a charging period is set to stabilize operations. The logic operation is then performed between operating periods.

Next, operations of the pass transistor circuit 1 of the above embodiment are described. In this specification, the H level is a voltage equal to or higher than half the source voltage Vdd, and the L level is a lower voltage than half the source voltage Vdd.

Operation During Charging Period

When the signal ENABLE2 reaches the H level, a current flows in the transistor 10a1 and the spin MOSFET 10B in series. The voltage Vmid at the node between the transistor 10a1 and the spin MOSFET 10B is determined by the resistance values in the transistor 10a1 and the spin MOSFET 10B. The voltage Vmid varies with the resistance state of the spin MOSFET 10B. The gate voltage of the transistor 10d1 is represented by Vgate.

The signal ENABLE1 is currently at the H level. When the signal ENABLE1 is at the H level, the source and the drain of the transistor 10d1 are electrically connected, and therefore, the voltage Vmid and the voltage Vgate are substantially the same. At this point, one of the first input/output terminal 24 and the second input/output terminal 26, or both the first input/output terminal 24 and the second input/output terminal 26 are set to the L level during the charging period. The charge amount by which the gate of the transistor 10d1 is charged depends on the resistance state of the spin MOSFET 10B.

When the resistance state of the spin MOSFET 10B is a high resistance state, the gate of the transistor 10d1 is positively charged. When the resistance state of the spin MOSFET 10B is a low resistance state, the gate of the transistor 10d1 is not positively charged, or is positively charged only by a small amount. After the charging is completed and the voltage Vgate becomes almost a fixed voltage, either the first input/output terminal 24 or the second input/output terminal 26 is set to the H level. After that, both the signal ENABLE1 and the signal ENABLE2 are set to the L level.

Operation During Operating Period

Since the signal ENABLE 1 is at the L level, the transistor 10c1 is in a non-conductive state. If the gate of the transistor 10d1 is positively charged by a sufficient charge amount, the first input/output terminal 24 and the second input/output terminal 26 are put into a conductive state, and are put into a connected state. On the other hand, if the gate of the transistor 10d1 is positively charged only by an insufficient charge amount, the first input/output terminal 24 and the second input/output terminal 26 are put into a non-conductive state, and are put into a disconnected state. In this manner, the operation of a charging period is performed immediately before a logic operation. As time passes, the gate of the transistor 10d1 is charged due to the leakage current from the transistor 10c1. Before the gate of the transistor 10d1 is charged due to the leakage current, the operation of a charging period is performed.

Figure 3:
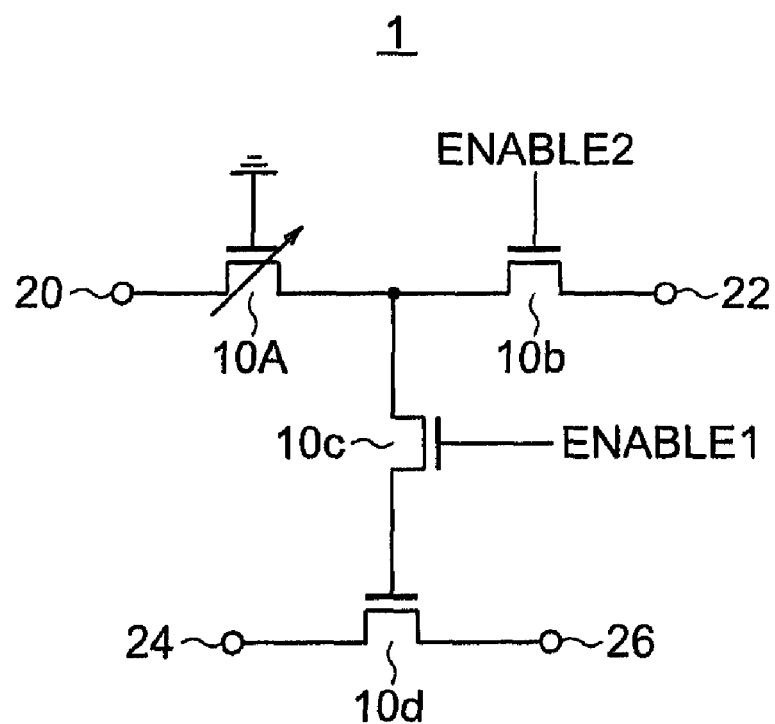
FIG. 3 is a circuit diagram of a pass transistor circuit according to an embodiment.

In this embodiment of the present invention, the transistor 10a shown in FIG. 1 is replaced with a p-type MOSFET, and the transistor 10b is replaced with an n-type spin MOSFET 10B. However, as in another embodiment illustrated in FIG. 3, the transistor 10a can be replaced with a p-type spin MOSFET 10A, and the transistor 10b can be replaced with an n-type MOSFET 10b1.

The transistor 10c and the transistor 10d are n-type MOSFETs in the above described embodiment. However, the transistor 10c and the transistor 10d can be p-type MOSFETs.

Figure 4:
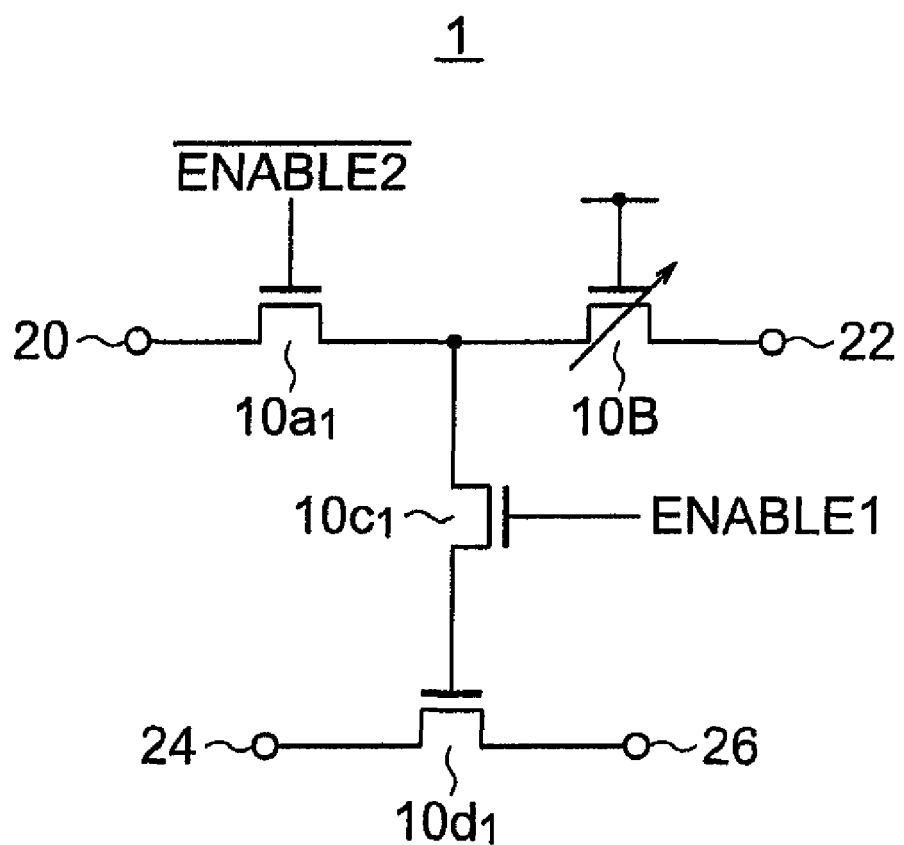
FIG. 4 is a circuit diagram of a pass transistor circuit according to an embodiment.

In the above described embodiment, the reference voltage GND is applied to the gate of the transistor 10a1, and the signal ENABLE2 is applied to the gate of the spin MOSFET 10B. However, as shown in FIG. 4, an inversion signal of the signal ENABLE2 can input into the gate of the transistor 10a1, and the source voltage Vdd can be applied to the gate of the spin MOSFET 10B.

In the above embodiment, a spin MOSFET is used as a device with memory function. However, an MTJ device can be used. In that case, control signals are unnecessary.

A conventional pass transistor circuit with memory function in which SRAMs are used as memory includes seven devices (six transistors in SRAMs and one pass transistor). In an embodiment, on the other hand, a pass transistor circuit with memory function can be realized with four devices. Furthermore, a conventional pass transistor circuit with memory function in which SRAMs are used as memory is a volatile memory, and therefore, cannot switch off power supplies. In an embodiment, however, power supplies can be switched off when a logic operation is not being performed. Therefore, a pass transistor circuit with memory function and less power consumption can be realized.

As described above, according to an embodiment, a pass transistor circuit with memory function can be realized with a small number of devices. Therefore, a pass transistor circuit that occupies a small area and yet has memory function can be realized, and a switching box circuit that occupies a small area can be obtained. By using pass transistor circuits with memory functions according to an embodiment, a switching box circuit that consumes only a small amount of power can be formed. Therefore, if pass transistor circuits with memory functions according to an embodiment are used, a highly-integrated reconfigurable logic circuit that consumes only a small amount of power can be realized.

Figure 16:
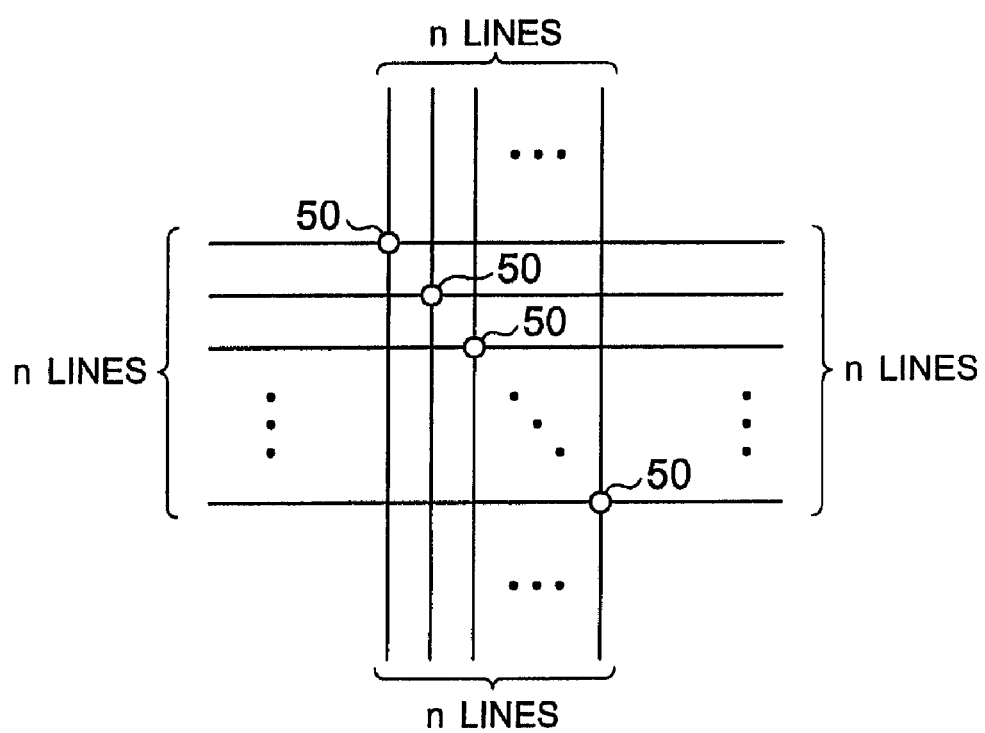
FIG. 16 is a circuit diagram of a switching block circuit according to an embodiment.

By using the above described switching box circuit, a switching block circuit 80 illustrated in FIG. 16 can be formed, for example. In this switching block circuit 80, n (≧1) signal lines are arranged in a longitudinal direction and in a transverse direction, and switching box circuits 50 that are the same as that illustrated in FIG. 14, for example, are located at the respective intersection points between the longitudinal signal lines and the transverse signal lines. The switching block circuit 80 having this structure also consumes only a small amount of power.

First Embodiment

Figure 5:
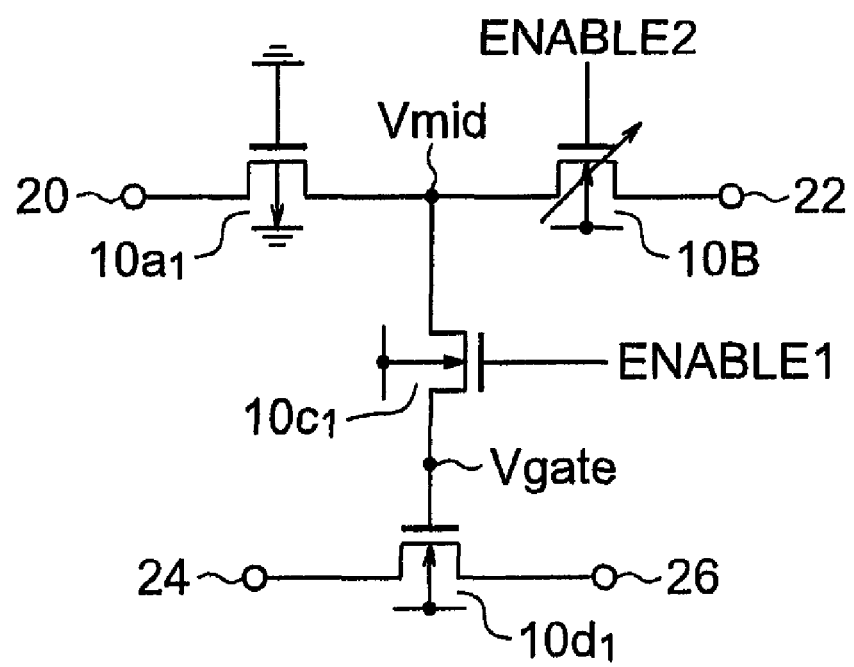
FIG. 5 is a circuit diagram of a pass transistor circuit according to a first embodiment.

FIG. 5 shows a pass transistor circuit with memory function according to a first embodiment. The pass transistor circuit 1 of this embodiment is the same as the pass transistor circuit 1 illustrated in FIG. 1, except that the transistor 10a is replaced with a p-type MOSFET 10a1 (hereinafter also referred to as the transistor 10a1), the transistor 10b is replaced with an n-type spin MOSFET 10B (hereinafter also referred to as the transistor 10B), the transistor 10c is replaced with an n-type MOSFET 10c1 (hereinafter also referred to as the transistor 10c1), and the transistor 10d is replaced with an n-type MOSFET 10d1 (hereinafter also referred to as the transistor 10d1). The reference voltage GND is applied to the gate of the transistor 10a1, the control signal ENABLE2 inputs into the gate of the transistor 10B, and the control signal ENABLE1 inputs into the gate of the transistor 10c1.

Figure 6A:
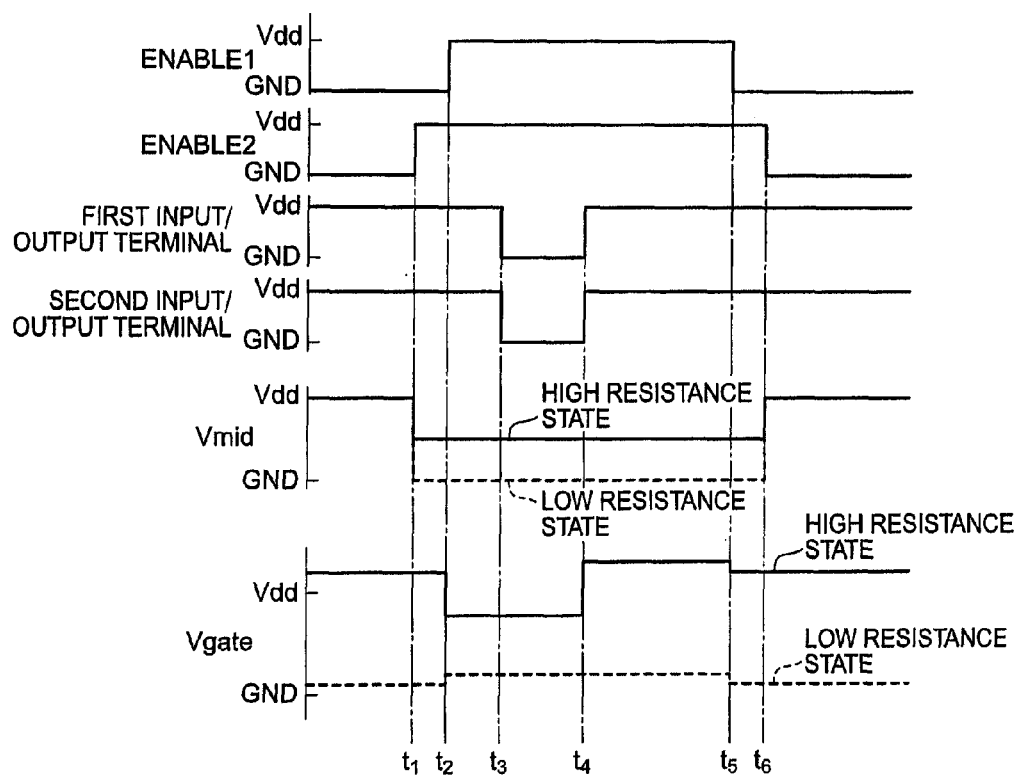
FIG. 6A shows waveform charts for explaining operations of the pass transistor circuit according to the first embodiment.

Referring to FIG. 6A, operations of the pass transistor circuit 1 of this embodiment are described. FIG. 6A shows waveform charts of the control signals ENABLE1 and ENABLE2, the first and second input/output terminals 24 and 26, and the voltages Vmid and Vgate. Here, the voltage Vmid is the voltage of the connection node between the drain of the transistor 10a1 and the drain of the transistor 10B, and the voltage Vgate is the voltage of the gate of the transistor 10d1.

In the waveforms of the voltage Vmid and Vgate in FIG. 6A, the solid line shows a waveform in the case that the spin MOSFET 10B is in the high resistance state, and the dashed line shows a waveform in the case that the spin MOSFET 10B is in the low resistance state. At the time $t_1$, the signal ENABLE2 is switched from the L level to the H level. The voltage Vmid then switches from the H level to the level corresponding to the resistance state of the spin MOSFET 10B. When the spin MOSFET 10B is in a high resistance state, the voltage Vmid is at the level between Vdd and GND. When the spin MOSFET 10B is in a low resistance state, the voltage Vmid is at the L level.

At the time $t_2$, the signal ENABLE1 is switched from the L level to the H level. The voltage Vmid then becomes substantially the same as the voltage Vgate. The time $t_2$ is substantially the same as the time $t_1$, or is behind the time $t_1$. It is preferable to switch the signal ENABLE2 from the L level to the H level, switch the voltage Vmid from the H level to the level corresponding to the resistance state of the spin MOSFET 10B, and then switch the signal ENABLE1 from the L level to the H level, as in this embodiment.

At the time $t_3$, the voltages of the first and second input/output terminals 24 and 26 are switched from the H level to the L level. In FIG. 6A, the voltages of the first input/output terminal 24 and the second input/output terminal 26 before the time $t_3$ are at the H level. However, the voltages of the first and second input/output terminals 24 and 26 before the time $t_3$ can be at the L level. The time $t_3$ at which the voltages of the first and second input/output voltage terminals 24 and 26 are switched to the L level is behind the time $t_2$ in FIG. 6A. However, the time $t_3$ can be before the time $t_2$ and behind the time $t_1$, or can be before the time $t_1$. Between the time $t_3$ and the time $t_4$, the gate of the transistor 10d1 is charged, or electric charges are discharged from the gate of the transistor 10d1.

At the time $t_4$, the voltages of the first and second input/output terminals 24 and 26 are switched from the L level to the H level. When the spin MOSFET 10B is in a high resistance state, the voltage Vgate becomes higher and increases to a larger value than Vdd. When the spin MOSFET 10B is in a low resistance state, however, the voltage Vgate hardly changes. This is because, when the spin MOSFET 10B is in a high resistance state, the voltage Vgate is higher than the value obtained by subtracting the threshold voltage of the transistor 10c1 from the voltage value of the control signal ENABLE1 serving as the gate voltage of the transistor 10c1, or is substantially the same as the value obtained by subtracting the threshold voltage of the transistor 10c1 from the voltage value of the control signal ENABLE1, and therefore, current hardly flows into the transistor 10c1. However, since the gate of the transistor 10d1 is positively charged, the voltage Vgate becomes a high voltage equal to or higher than the source voltage Vdd.

At the time $t_5$, the control signal ENABLE1 is switched from the H level to the L level. The value of the voltage Vgate then becomes slightly smaller. Between the time $t_2$ and the time $t_5$, the voltages Vmid and Vgate depend on the resistance state of the spin MOSFET 10B. It should be noted that the time $t_5$ is behind the time $t_4$. At the time $t_5$, the voltage Vgate becomes lower. However, the decrease in voltage is very small, and does not affect the operations of the pass transistor 10d1. As the control signal ENABLE1 is switched to the L level, the transistor 10c1 becomes a non-conductive state. Therefore, even if the voltage Vmid varies, the voltage Vgate only slightly changes.

At the time $t_6$, the control signal ENABLE2 is switched from the H level to the L level. Since the control signal ENABLE1 is at the L level, the transistor 10c1 is in a non-conductive state. The electric charges charged into the gate of the transistor 10d1 are kept in the gate of the transistor 10d1. It should be noted that the time $t_6$ is substantially the same as the time $t_5$, or is behind the time $t_5$.

The operation described above is called a charging operation, and the period during performing the operation described above is called a charging period. In FIG. 6A, the period from the time $t_1$ to the time $t_6$ is a charging period.

As shown in FIG. 6A, after the operation described above, the voltage Vgate has large difference between a high resistance state and a low resistance state of the spin MOSFET 10B. In a high resistance state, the voltage Vgate is very high. In a low resistance state, the voltage Vgate is low.

When the spin MOSFET 10B is in a high resistance state, the gate of the transistor 10d1 is sufficiently charged. Therefore, the transistor 10d1 is in a conductive state, and the first and second input/output terminals 24 and 26 are connected conductively.

When the spin MOSFET 10B is in a low resistance state, on the other hand, the gate of the transistor 10d1 is hardly charged. Therefore, the transistor 10d1 is in a non-conductive state, and the first and second input/output terminals 24 and 26 are disconnected.

When the control signals ENABLE1 and ENABLE2 are at the L level, the pass transistor circuit with memory function of this embodiment performs a logic operation.

Figure 6B:
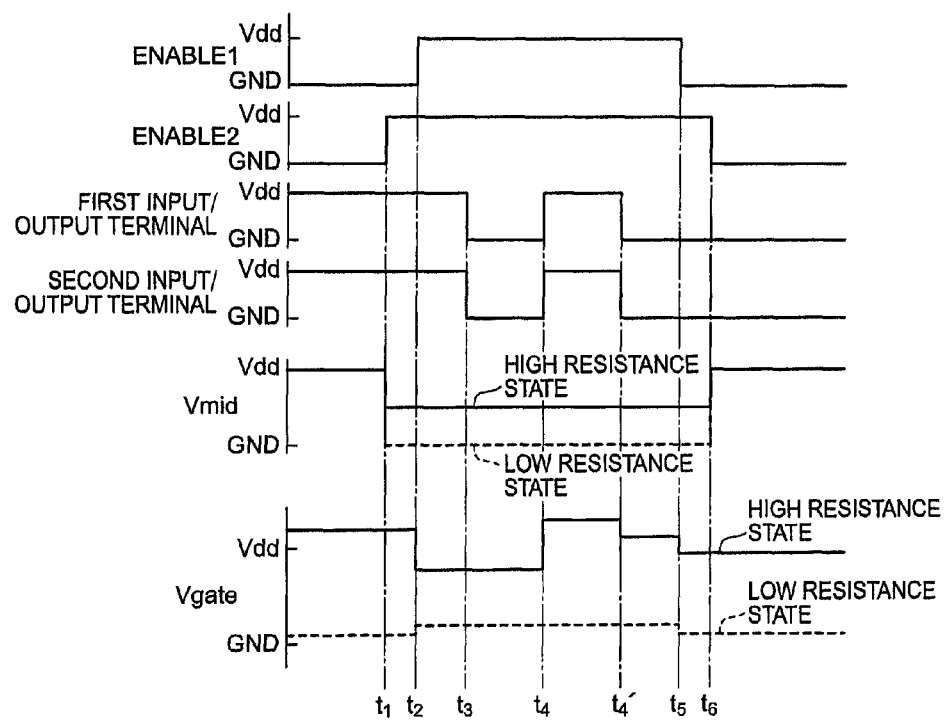
FIG. 6B shows waveform charts for explaining operations of the pass transistor circuit according to the first embodiment.

In the operation described above, the voltages of the first and second input/output terminals 24 and 26 are at the H level after the time $t_4$. However, the voltages of the first and second input/output terminals 24 and 26 can be switched to the L level at the time $t_4'$ between the time $t_4$ and the time $t_5$, or can be switched to the L level between the time $t_5$ and the time $t_6$ as shown in FIG. 6B.

When the spin MOSFET 10B is in a low resistance state, the gate of the transistor 10d1 is charged due to the leakage current from the transistor 10c1 as time passes, and the voltage Vgate becomes higher. After a very long period of time has passed, the voltage Vgate becomes higher than the threshold voltage Vth of the transistor 10d1, and causes an incorrect operation. To prevent incorrect operations, it is preferable to perform a charging operation just before a logic operation or perform a charging operation at regular intervals.

The charging intervals τc at the regular cycle which a charging operation is performed are determined by the capacitance component Cg of the gate of the transistor 10d1 and the resistance Roff between the source and the drain of the transistor 10c1 in a non-conductive state. The charging intervals τc at the regular cycle which a charging operation is performed need to be shorter than Cg×Roff/2. In this embodiment τC=10 μs.

Since the spin MOSFET 10B is a nonvolatile memory, the power supply to the pass transistor circuit with memory function of this embodiment is cut off when the pass transistor circuit with memory function is not performing a logic operation.

While a conventional pass transistor circuit with memory function in which SRAMs are used as memory uses seven devices, the pass transistor circuit with memory function of this embodiment can be realized with four devices. Further, the conventional pass transistor circuit with memory function in which SRAMs are used as memory is a volatile memory, and therefore, cannot switch off power supplies. In this embodiment, on the other hand, power supplies can be switched off while a logic operation is not being performed. Therefore, a pass transistor circuit with memory function and less power consumption can be realized.

As described above, according to this embodiment, a pass transistor circuit with memory function can be realized with a small number of devices. Therefore, a pass transistor circuit that occupies a small area and yet has memory function can be realized, and a switching box circuit that occupies a small area can be obtained.

By using pass transistor circuits with memory functions according to this embodiment, a switching box circuit that consumes only a small amount of power can be formed. Therefore, if pass transistor circuits with memory functions according to this embodiment are used, a highly-integrated reconfigurable logic circuit that consumes only a small amount of power can be realized.

Second Embodiment

Figure 7:
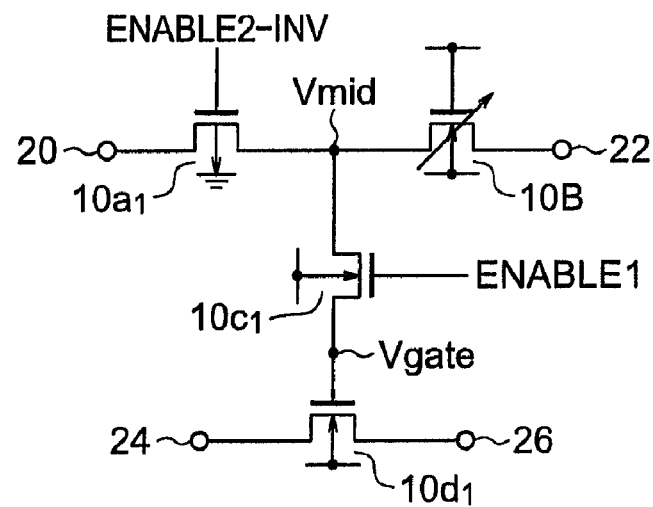
FIG. 7 is a circuit diagram of a pass transistor circuit according to a second embodiment.

FIG. 7 shows a pass transistor circuit according to a second embodiment. The pass transistor circuit of this embodiment is the same as the pass transistor circuit of the first embodiment illustrated in FIG. 5, except that an inversion control signal ENABLE2-INV of the control signal ENABLE2 inputs into the gate of the transistor 10a1, and the source voltage Vdd is applied to the gate of the spin MOSFET 10B.

In the pass transistor circuit of this embodiment having the above structure, a logic operation is performed after a charging operation is performed, as in the first embodiment.

Like the first embodiment, this embodiment can realize a pass transistor circuit with memory function and less power comsumption.

A pass transistor circuit with memory function can be realized with a small number of devices. Therefore, a pass transistor circuit that occupies a small area and yet has memory function can be realized, and a switching box circuit that occupies a small area can be obtained.

Further, by using pass transistor circuits with memory functions according to this embodiment, a switching box circuit that consumes only a small amount of power can be formed. Therefore, if pass transistor circuits with memory functions according to this embodiment are used, a highly-integrated reconfigurable logic circuit that consumes only a small amount of power can be realized.

Third Embodiment

Figure 8:
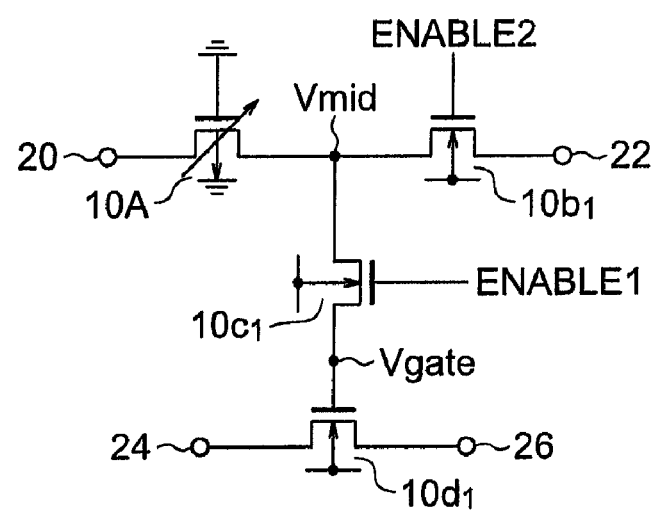
FIG. 8 is a circuit diagram of a pass transistor circuit according to a third embodiment.

FIG. 8 shows a pass transistor circuit according to a third embodiment. The pass transistor circuit of this embodiment is the same as the pass transistor circuit of the first embodiment illustrated in FIG. 5, except that the transistor 10a1 is replaced with a p-type spin MOSFET 10A, and the spin MOSFET 10B is replaced with an n-type MOSFET 10b1 (hereinafter also referred to as the transistor 10b1). The reference voltage GND is applied to the gate of the spin MOSFET 10A, and the control signal ENABLE2 inputs into the gate of the transistor 10b1.

In the pass transistor circuit of this embodiment having the above structure, a logic operation is performed after a charging operation is performed, as in the first embodiment. This embodiment differs from the first embodiment in that the transistor 10d1 is in a non-conductive state when the p-type spin MOSFET 10A is in a high resistance state, and the transistor 10d1 is in a conductive state when the p-type spin MOSFET 10A is in a low resistance state.

Like the first embodiment, this embodiment can realize a pass transistor circuit with memory function and less power consumption.

A pass transistor circuit with memory function can be realized with a small number of devices. Therefore, a pass transistor circuit that occupies a small area and yet has memory function can be realized, and a switching box circuit that occupies a small area can be obtained.

Further, by using pass transistor circuits with memory functions according to this embodiment, a switching box circuit that consumes only a small amount of power can be formed. Therefore, if pass transistor circuits with memory functions according to this embodiment are used, a highly-integrated reconfigurable logic circuit that consumes only a small amount of power can be realized.

Figure 9:
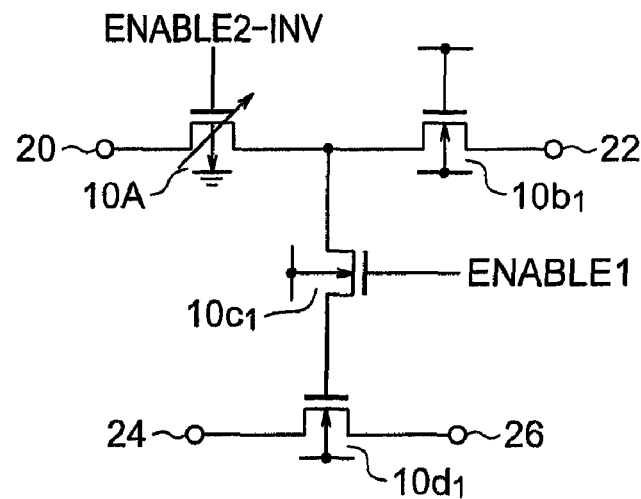
FIG. 9 is a circuit diagram of a pass transistor circuit according to a modification of the third embodiment.

In this embodiment, the control signal ENABLE2-INV can input into the gate of the p-type spin MOSFET 10A, and the source voltage Vdd can be applied to the gate of the transistor 10b1, as shown in FIG. 9. The pass transistor circuit according to the modification of this embodiment illustrated in FIG. 9 can also achieve the same effects as those of this embodiment.

Fourth Embodiment

Figure 10:
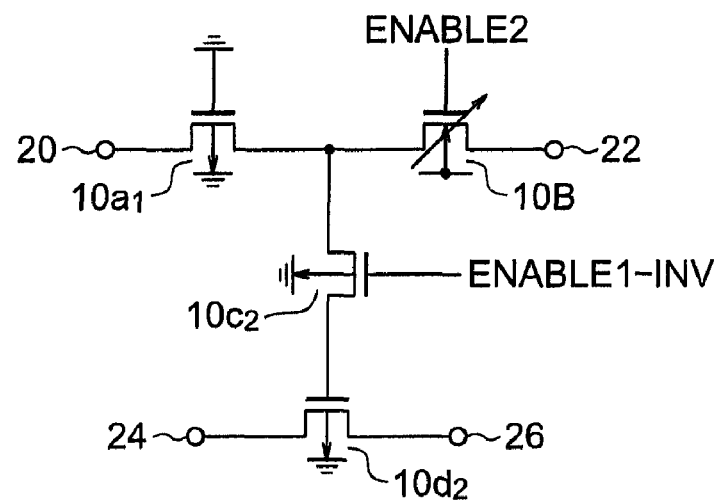
FIG. 10 is a circuit diagram of a pass transistor circuit according to a fourth embodiment.

FIG. 10 shows a pass transistor circuit according to a fourth embodiment. The pass transistor circuit of this embodiment is the same as the pass transistor circuit of the first embodiment illustrated in FIG. 5, except that the n-type MOSFETs 10c1 and 10d1 are replaced with p-type MOSFETs 10c2 and 10d2, and the inversion signal ENABLE1-INV of the control signal ENABLE1 inputs into the gate of the p-type MOSFET 10c2.

In the pass transistor circuit of this embodiment, a logic operation is performed after a charging operation is performed, as in the first embodiment. In this embodiment, the p-type MOSFET 10d2 is in a non-conductive state when the n-type spin MOSFET 10B is in a high resistance state, and the p-type MOSFET 10d2 is in a conductive state when the n-type spin MOSFET 10B is in a low resistance state.

In modifications of the fourth embodiment, the n-type MOSFETs 10c1 and 10d1 can be replaced with p-type MOSFETs, and the signal ENABLE1 can be replaced with the signal ENABLE1-INV in the pass transistor circuits illustrated in FIGS. 7, 8, and 9.

Like the first embodiment, this embodiment and those modifications can each realize a pass transistor circuit with memory function and less power consumption.

A pass transistor circuit with memory function can be realized with a small number of devices. Therefore, a pass transistor circuit that occupies a small area and yet has memory function can be realized, and a switching box circuit that occupies a small area can be obtained.

Further, by using pass transistor circuits with memory functions according to this embodiment, a switching box circuit that consumes only a small amount of power can be formed. Therefore, if pass transistor circuits with memory functions according to this embodiment are used, a highly-integrated reconfigurable logic circuit that consumes only a small amount of power can be realized.

Fifth Embodiment

Figure 11:
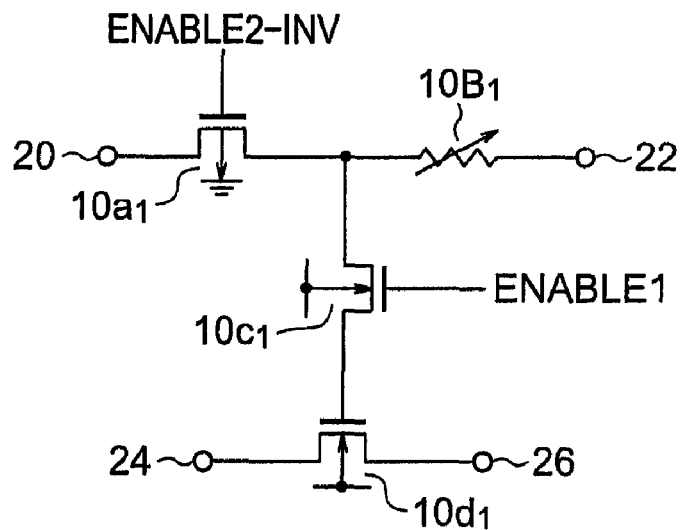
FIG. 11 is a circuit diagram of a pass transistor circuit according to a fifth embodiment.

FIG. 11 shows a pass transistor circuit according to a fifth embodiment. The pass transistor circuit of this embodiment is the same as the pass transistor circuit of the first embodiment illustrated in FIG. 5, except that the spin MOSFET 10B is replaced with an MTJ device 10B1, and the control signal ENABLE2-INV inputs into the gate of the transistor 10a1. The MTJ device 10B1 is connected in series to the transistor 10a1. The MTJ device 10B1 is either in a high resistance state or in a low resistance state in a nonvolatile manner.

In this embodiment, a logic operation is performed after a charging operation is performed, as in the first embodiment. In this embodiment, the transistor 10d1 is in a conductive state when the MD device 10B1 is in a high resistance state, and the transistor 10d1 is in a non-conductive state when the MTJ device 10B1 is in a low resistance state.

Figure 12:
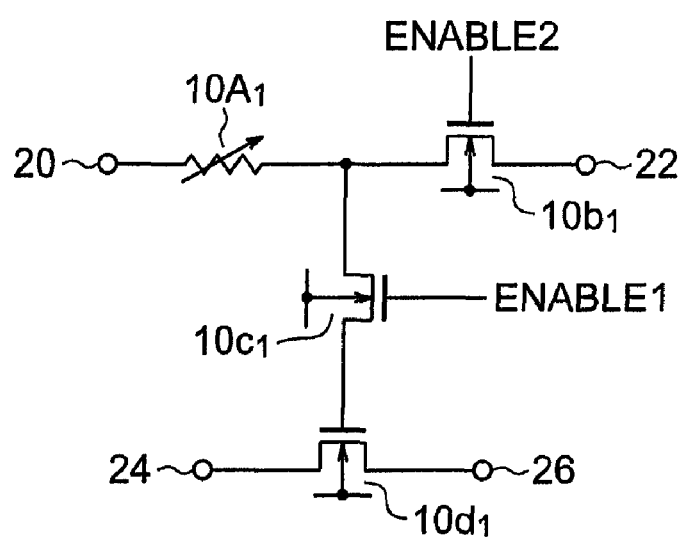
FIG. 12 is a circuit diagram of a pass transistor circuit according to a modification of the fifth embodiment.

In a modification of the fifth embodiment, the transistor 10a1 can be replaced with an MTJ device 10A1, the MTJ device 10B1 can be replaced with an n-type MOSFET 10b1, and the control signal ENABLE2 can input into the gate of the transistor 10b1, as shown in FIG. 12.

In each of the first through fourth embodiments and the modifications thereof, the spin MOSFET can be replaced with an MTJ device.

Like the first embodiment, this embodiment can realize a pass transistor circuit with memory function and less power consumption.

A pass transistor circuit with memory function can be realized with a small number of devices. Therefore, a pass transistor circuit that occupies a small area and yet has memory function can be realized, and a switching box circuit that occupies a small area can be obtained.

Further, by using pass transistor circuits with memory functions according to this embodiment, a switching box circuit that consumes only a small amount of power can be formed. Therefore, if pass transistor circuits with memory functions according to this embodiment are used, a highly-Integrated reconfigurable logic circuit that consumes only a small amount of power can be realized.

Sixth Embodiment

Figure 13:
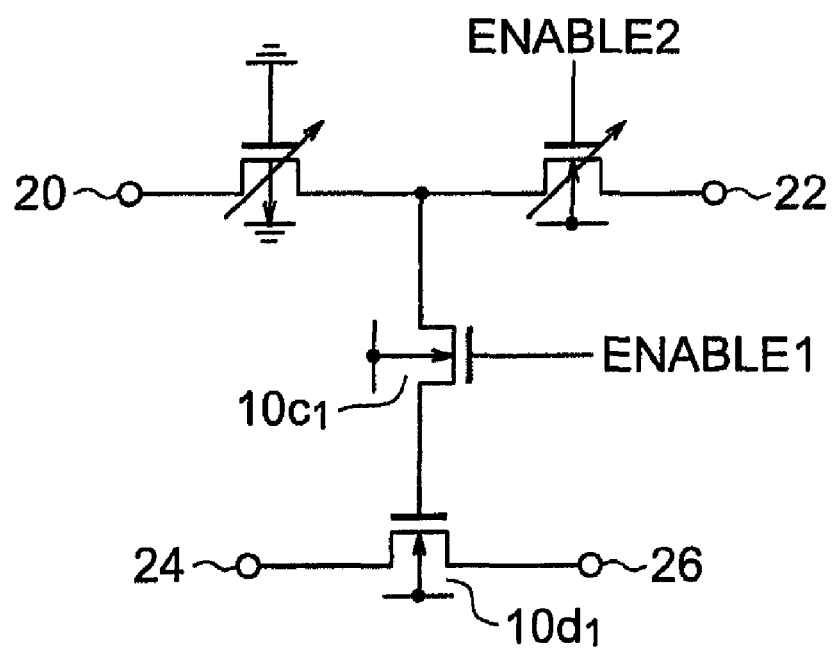
FIG. 13 is a circuit diagram of a pass transistor circuit according to a sixth embodiment.

FIG. 13 shows a pass transistor circuit according to a sixth embodiment. The pass transistor circuit of this embodiment is the same as the pass transistor circuit of the first embodiment illustrated in FIG. 5, except that the p-type MOSFET 10a1 is replaced with a p-type spin MOSFET 10A. That is, the two spin MOSFETs 10A and 10B are connected in series.

In this embodiment, the magnetization state of one of the two spin MOSFETs 10A and 10B is an antiparallel state, and the magnetization state of the other one of the spin MOSFETs 10A and 10B is a parallel state. As the magnetization states of the two spin MOSFETs 10A and 10B connected in series have a mutually complementary relationship with each other, a great change in resistance can be achieved, and therefore, stable circuit operations can be realized.

In this embodiment, a logic operation is performed after a charging operation is performed, as in the first embodiment.

Like the first embodiment, this embodiment can realize a pass transistor circuit with memory function and less power consumption.

Further, a pass transistor circuit with memory function can be realized with a small number of devices. Therefore, a pass transistor circuit that occupies a small area and yet has memory function can be realized, and a switching box circuit that occupies a small area can be obtained.

By using pass transistor circuits with memory functions according to this embodiment, a switching box circuit that consumes only a small amount of power can be formed. Therefore, if pass transistor circuits with memory functions according to this embodiment are used, a highly-integrated reconfigurable logic circuit that consumes only a small amount of power can be realized.

In this embodiment, the reference voltage GND is applied to the gate of the spin MOSFET 10A, and the control signal ENABLE2 inputs into the gate of the spin MOSFET 10B. However, the control signal ENABLE-INV can input into the gate of the spin MOSFET 10A, and the source voltage Vdd can be applied to the gate of the spin MOSFET 10B.

Although n-type MOSFETs are used as the transistors 10c1 and 10d1 in this embodiment, p-type MOSFETs can be used as the transistors 10c1 and 10d1.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A pass transistor circuit comprising:
a first input/output terminal connected to a first signal line;
a second input/output terminal connected to a second signal line;
a first device having first and second terminals, the first terminal being connected to a first power supply voltage;
a second device having third and fourth terminals, the third terminal being connected to the second terminal, the fourth terminal being connected to a second power supply voltage;
a first transistor, one of a source/drain of the first transistor being connected to the second terminal, a gate of the first transistor receiving a first control signal, the first transistor being in one of a turn-off state and a turn-on state depending on the first control signal; and
a second transistor, a gate of the second transistor being connected to the other one of the source/drain of the first transistor, one of a source/drain of the second transistor being connected to the first input/output terminal, the other one of the source/drain of the second transistor being connected to the second input/output terminal,
one of the first and second devices being a nonvolatile memory device, the other one of the first and second devices being a MOSFET, and a charge amount at the gate of the second transistor depending on a resistance state of the nonvolatile memory device when the first transistor is in the turn-off state.

2. The circuit according to claim 1, wherein the nonvolatile memory device is a spin MOSFET.

3. The circuit according to claim 2, wherein the first device is a p-type MOSFET, and the second device is an n-type spin MOSFET.

4. The circuit according to claim 2, wherein the first device is a p-type spin MOSFET, and the second device is an n-type MOSFET.

5. The circuit according to claim 2, wherein the first device is a p-type spin MOSFET, and the second device is an n-type spin MOSFET.

6. The circuit according to claim 1, wherein the first and second transistors are n-type MOSFETs.

7. The circuit according to claim 1, wherein the first and second transistors are p-type MOSFETs.

8. The circuit according to claim 1, wherein the first device is an MTJ device, and the second device is a MOSFET.

9. A switching box circuit comprising:
the pass transistor circuit according to claim 1; and
the first and second signal lines.

10. The circuit according to claim 9, wherein the nonvolatile memory device is a spin MOSFET.

11. The circuit according to claim 10, wherein the first device is a p-type MOSFET, and the second device is an n-type spin MOSFET.

12. The circuit according to claim 10, wherein the first device is a p-type spin MOSFET, and the second device is an n-type MOSFET.

13. The circuit according to claim 10, wherein the first device is a p-type spin MOSFET, and the second device is an n-type spin MOSFET.

14. The circuit according to claim 9, wherein the first and second transistors are n-type MOSFETs.

15. The circuit according to claim 9, wherein the first and second transistors are p-type MOSFETs.

16. The circuit according to claim 9, wherein the first device is an MTJ device, and the second device is a MOSFET.

* * * * *